United States Patent [19]
Onda et al.

[11] Patent Number: 5,785,763
[45] Date of Patent: Jul. 28, 1998

[54] ELECTRON-GUN EVAPORATION SYSTEM HAVING EVAPORATION-SOURCE STREAM REGULATOR

[75] Inventors: Kazuhiko Onda; Yasuko Hori; Akira Fujihara, all of Tokyo, Japan

[73] Assignee: NEC Corporation, Tokyo, Japan

[21] Appl. No.: 521,029

[22] Filed: Aug. 29, 1995

[30] Foreign Application Priority Data

Aug. 30, 1994 [JP] Japan .................. 6-205235

[51] Int. Cl.$^6$ ............... C23C 16/00; C23C 14/30
[52] U.S. Cl. ............... 118/723 EB; 118/723 VE; 118/723 CB; 118/728; 118/730
[58] Field of Search ........... 118/723 VE, 723 EB, 118/723 CB, 728, 730, 726

[56] References Cited

U.S. PATENT DOCUMENTS

| | | | |
|---|---|---|---|
| 3,467,057 | 9/1969 | Tamura | 118/723 EB |
| 4,303,694 | 12/1981 | Bois | 427/42 |
| 4,448,802 | 5/1984 | Buhl | 427/42 |
| 5,403,400 | 4/1995 | Nishiguchi | 118/723 EB |
| 5,601,652 | 2/1997 | Mullin | 118/723 EB |

FOREIGN PATENT DOCUMENTS

| | | | |
|---|---|---|---|
| 60-165372 | 8/1985 | Japan | 118/723 EB |
| 64-65258 | 3/1989 | Japan . | |
| 1-222045 | 9/1989 | Japan . | |
| 6-108234 | 4/1994 | Japan | 118/723 EB |

*Primary Examiner*—R. Bruce Breneman
*Assistant Examiner*—Jeffrie R. Lund
*Attorney, Agent, or Firm*—Foley, Hoag & Eliot LLP

[57] ABSTRACT

A collimator is provided in an evaporation chamber to prevent the stray electrons from reaching a semiconductor substrate on which a film of the source is deposited. The collimator has a wall that prevent the stray electrons from reaching the evaporation object and a window that allows the gaseous evaporation source to travel to the object. The problem caused by the stray electrons can be solved with a simple structure, realizing a better evaporation process on the substrate.

19 Claims, 4 Drawing Sheets

ELECTRON-GUN EVAPORATION SYSTEM HAVING EVAPORATION-SOURCE STREAM REGULATOR

BACKGROUND OF THE INVENTION

1. Field of the Invention

The present invention relates to an electron-gun evaporation system applicable to semiconductor device fabrication and more particularly, to an electron-gun evaporation system having a collimator in an evaporation chamber, in which unwanted effects due to the stray electrons is restrained effectively.

2. Description of the Prior Art

The electron-gun evaporation technology has been employed in various fabrication processes for electronic devices or components such as semiconductor electronic or optical devices, and liquid crystal displays (LCDs). This technology generally provides less damage to an evaporation object or target during the evaporation process than, sputtering technology which employs heavy particles, such as argon (Ar). Therefore, the electron-gun evaporation technology is quite effective for materials such as compound semiconductors that are more difficult to recover from the damage than silicon (Si).

Also, the electron-gun evaporation technology facilitates metal pattern formation using the lift-off process and therefore, it can be effectively employed in the formation of fine or miniaturized electrodes of semiconductor devices using the electron-beam exposure technology. Accordingly, a lift-off process using the electron-gun evaporation technology has been employed in the formation of fine gate electrodes of compound semiconductor field-effect transistors (FETs).

An example of conventional electron-gun evaporation systems is shown in FIG. 1, which contains an evaporation chamber 51. The chamber 51 is placed in a vacuum during evaporation by a vacuum pump system (not shown in FIG. 1).

In the chamber 51, an evaporation source holder 52, such as a crucible, is fixed to a bottom wall of the chamber 51 by a support 61. As an evaporation source 52a, a material in a condensed phase such as a solid metal is placed on the source holder 52 during an evaporation process. An electron gun 60 is fixed to a bottom wall of the chamber 51. Only a filament of the gun 60 is shown in FIG. 1 for the sake of simplification. A substrate holder 53 is fixed to a top wall of the chamber 51 by a rod-like support 59. The holder 53 is made of a circular plate and can rotate in a horizontal plane around the support 59 along an arrow in FIG. 1. At least one semiconductor substrate or wafer 54 is attached onto the lower surface of the holder 53 during an evaporation process.

A magnetic-field generator (not shown in FIG. 1.) is used as an electron-beam controller either inside or outside the chamber 51 to generate a magnetic field 58 in the vicinity of the electron gun 60 and the evaporation source holder 52. The direction of the field 58 is perpendicular to the paper and is oriented from the front of the paper toward the rear thereof. The magnetic field 58 curves an electron beam 56 produced and emitted upward by the electron gun 60 toward the holder 52, as shown in FIG. 1.

An evaporation process is performed in the conventional electron-gun evaporation system of FIG. 1 as follows:

Before starting the evaporation process, the evaporation source 52a in a condensed phase such as a solid metal is placed on the evaporation source holder 52 and the semiconductor substrate or wafer 54 as an evaporation receiver or object is attached onto the substrate holder 53.

The chamber 51 is then evacuated by the vacuum pumping system. So that the interior pressure of the chamber 51 is reduced to a specified value that is sufficiently low for the evaporation process.

Next, an electric current is supplied to the filament of the electron g un 60 to produce and omit an electron beam 56 from the gun 60. The electron beam 56 emitted upward from the gun 60 is curved toward the evaporation source 52a by the magnetic field 58. Thus, the evaporation source 52a is heated to be vaporized or evaporated due to the electron bombardment, producing a gaseous source. This gaseous evaporation source travels upward to be condensed and deposited onto the substrate 54. Thus, a film of the evaporation source 52a is formed on the substrate 54.

With the conventional electron-gun evaporation system of FIG. 1, the orientation of the electron beam 56 is controlled by the magnetic field 58, so that stray electrons tend to occur in the chamber 51 when the electron beam 56 is emitted onto the evaporation source 52a. A part of the stray electrons are scattered in the chamber 51 and reach the substrate 54.

The stray electrons are typically made of (1) some of primary electrons that are emitted from the electron gun 60 and are not controlled by the magnetic field 58, (2) secondary electrons generated from the evaporation-source 52a due to the bombardment of the primary electrons, and (3) primary electrons that are reflected by the source 52a.

In the case of the substrate 54 having an organic material such as a photoresist or an electron-beam resist, the molecular chains of the material tend to be cut due to the radiation of the stray electrons, generating a gaseous substance or substances. The substance or substances prevent the gaseous evaporation source from being deposited, so that a problem that the deposited evaporation film is stripped off or the like occur. Electron-beam resists popularly have this problem, which exerts a bad influence on a lift-off process for the electrode formation.

For example, the radiation of the stray electrons dissociates $H_2$, $CH_3$, $CH_4$, $CO$ and $CO_2$ from poly(methyl methacrylate) (PMMA), i.e., $(—C_5\ H_8O_2—)_n$. Therefore, some of these dissociated substances vaporize in a PMMA electron-beam resist and blow but from the resist, disturbing the evaporation process.

In case of a refractory metal evaporation, the electron beam 56 requires a great power. AS a result, the number of the stray electrons becomes greater, increasing the volume of the gaseous dissociated substances.

The above problem due to the stray electrons is quite serious when the evaporation object or receiver, i.e., the substrate 54 itself tends to suffer any radiation damage due to the electrons. There is a possibility that the electron-gun evaporation technology is unable to be employed in this case.

As the gate electrode material of the compound semiconductor FETs, various metals such as Al, Ti, Pt, Au have been used widely. Metals having comparatively low malting points such as Au and Al can be evaporated or deposited with comparative readiness by the electron-gun evaporation technology even if the electron gun 60 is not supplied with great power. However, refractory metals having high melting points such as Pt, W and Mo require either (a) a great power supplied to the electron gun 60 (b) or a high power density per unit area of the electron beam 56 on the substrate 54 which is produced by a narrowed spot of the beam 56.

In the latter case (b), an obtainable deposition rate is comparatively low because an obtainable flux size or thickness of the gaseous evaporation source is limited. This means that the film growth needs a considerably long time. Accordingly, to perform the evaporation process efficiently, higher power needs to be supplied to the electron fun 60, which leads to the above problem due to the stray electrons.

Another example of conventional evaporation systems is disclosed in the Japanese Non-Examined Patent Publication No. 64-65258, which was published in 1989. No electron gun was shown in this publication.

This system contains a plate-like collimator having a penetrating slit through which an- gaseous evaporation source travels to be collimated between an evaporation source and an evaporation object in a chamber. The collimator has parallel guide rails that are fixed on the lower side of the collimator and are placed at each end of the slit. A rack extending along the rails is fixed near one of the rails. A scraping or scrubbing member is supported by the guide rails, so that the member can move in a direction perpendicular to the slit. The upper edge of the member is contacted with the lower side of the collimator. A motor having a gear is fixed on the member. The gear is engaged with the rack. The evaporation source deposited onto the lower side of the collimator can be removed by moving the scrubbing member. The removed material is held or collected in an underlying, removable collection box.

Still another example of the conventional evaporation systems having a collimator is disclosed in the Japanese Non-Examined Patent Publication No. 1-222045, which was published in 1989. No electron gun was shown in this publication.

This system contains collimators for limiting the flows or streams of a gaseous evaporation source in a chamber. The system further contains injection cells for injecting the gaseous evaporation source outside the chamber. Each of the collimators is positioned on a straight line extending from the corresponding injection cell to an evaporation object or receiver. Due to the collimators, the vaporized evaporation source supplied from the cells is scarcely deposited on the inner wall of the chamber.

SUMMARY OF THE INVENTION

Accordingly, an object of the present invention is to provide an electron-gun evaporation system that addresses the above problem caused by the stray electrons with a simple structure.

Another object of the present invention is to provide an electron-gun evaporation system that provides a better evaporation process on an evaporation object or receiver than the case of the conventional ones.

An electron-gun evaporation system according to the present invention contains a collimator in an evaporation chamber. The collimator has a function of preventing stray electrons from reaching an evaporation object or receiver. The collimator has a wall that prevents the stray electrons from reaching the evaporation object and a window that allows the gaseous evaporation source to travel to the object.

Preferably, the collimator is fixed to an evaporation object holder or fixed to the chamber itself. The window of the collimator is placed at a position where the gaseous source can travel to the object through the window. The wall of the collimator is placed surround the stream of the gaseous source.

Although the collimator is made of any material through which the stray electrons cannot penetrate, it is preferably made of a stainless steel.

With the electron-gun evaporation system according to the present invention, the wall of the collimator prevents the stray electrons from reaching the evaporation object and the window of the collimator allows the gaseous evaporation source to travel to the object. Therefore, almost all the stray electrons generated in the chamber can be prevented from reaching the object by the wall of the collimator.

A part of the stray electrons travel through the window of the collimator to the object. However, since almost all the stray electrons can be prevented from reaching the object by the wall, the above problem due to the stray electrons, i.e., the strip-off of the deposited film and/or the radiation damage, can be solved.

DETAILED DESCRIPTION OF THE PREFERRED EMBODIMENTS

Figure 1:
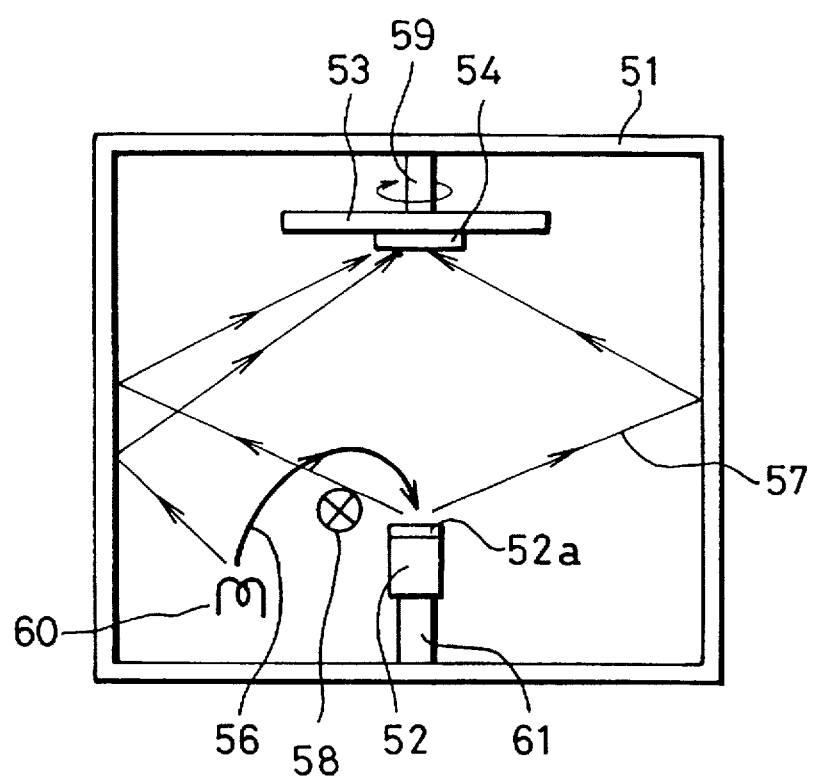
FIG. 1 is a schematic, cross-sectional view of a conventional electron-gun evaporation system.

Preferred embodiments of the present invention will be described below while referring to the drawings attached.

FIRST EMBODIMENT

Figure 2:
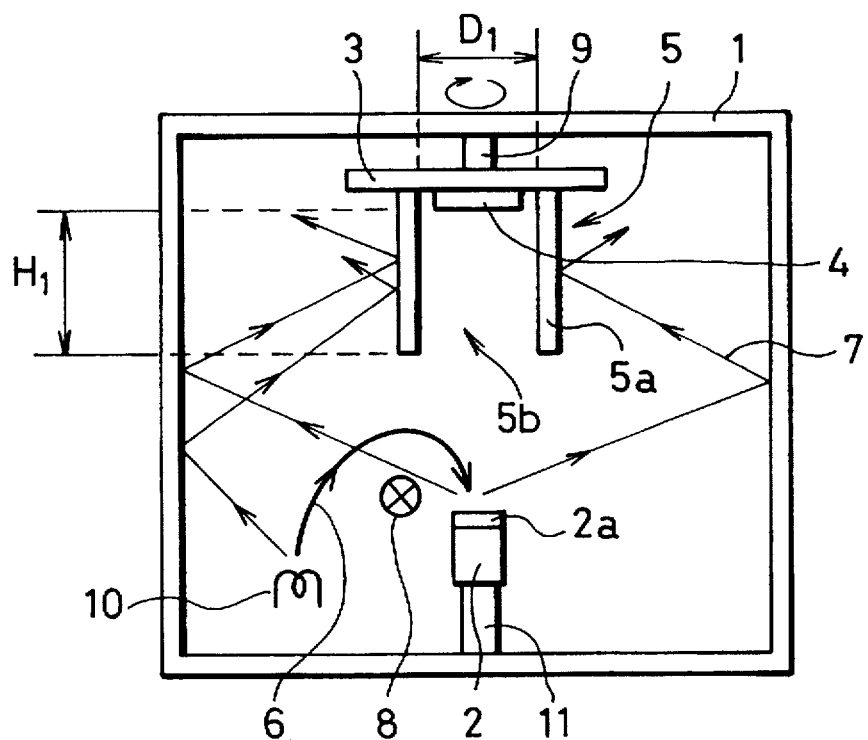
FIG. 2 is a schematic, cross-sectional view of an electron-gun evaporation system according to a first embodiment of the invention.

An electron-gun evaporation system according to a first embodiment is shown in FIG. 2. This system contains an evaporation chamber 1 that is held in vacuum during evaporation by a vacuum pump system (not shown in FIG. 2).

In the chamber 1, an evaporation source holder 2 such as a crucible is fixed to a bottom wall of the chamber 1 by a support 11. As an evaporation source 2a, a material in a condensed phase, such as a solid metal, is placed on the source holder 2 during an evaporation process. An electron gun 10 is fixed to a side or bottom wall of the chamber 1. Only a filament of the gun 10 is shown in FIG. 2 for the sake of simplification. A substrate holder 3 is fixed to a top wall of the chamber 1 by a rod-like support 9. The holder 3 is made of a circular plate and can rotate in a horizontal plane around the support 9 along an arrow in FIG. 2. A semiconductor substrate or wafer 4, an evaporation object or receiver, is attached onto the lower surface of the holder 3 during an evaporation process.

A magnetic-field generator (not shown in FIG. 2) an electron-beam controller, is provided inside or outside the chamber 1 to generate a magnetic field 8 in the vicinity of the electron gun 10 and the evaporation source holder 2. The direction of the field 8 is perpendicular to-the paper and is oriented from the front of the paper toward the rear thereof. The magnetic field 8 curves an electron beam 6 produced and emitted upward by the electron gun 10 toward the holder 2, as shown in FIG. 2.

A cylindrical collimator 5 is fixed onto the lower surface of the circular substrate holder 3 so that the central axis of the collimator 5 accords with the center of the holder 3. The substrate 4 is attached onto the holder 3 so that the center of the substrate 4 is positioned on the center of the holder 3. The collimator 5 has mainly a function of preventing the stray electrons from reaching the substrate 4 as the evaporation object or receiver.

Here, the collimator 5 is made of stainless steel, and has a bottom-less cylindrical wall 5a and a circular window 5b formed at a lower end of the wall 5a. The upper end of the wall 5a is fixed onto the holder 3.

The wall 5a surrounds the substrate 4 when attached onto the holder 3. In other words, the substrate 4 is contained in the collimator 5. The collimator 5 is placed right over the source holder 2. The wall 5a is perpendicular to the surface of the substrate 4.

An evaporation process is performed in the electron-gun evaporation system according to the first embodiment as follows:

Before starting the evaporation process, a solid metal as the evaporation source 2a is placed on the evaporation source holder 2 and the semiconductor substrate 4 as the evaporation receiver or object is attached onto the substrate holder 3. The holder 3 is rotated during the evaporation process along the arrow in FIG. 2 after the substrate 4 is attached.

The evaporation chamber 1 is then evacuated by the vacuum pumping system, so that the interior pressure of the chamber 1 is reduced to a specified value that is sufficiently low for the evaporation process.

Next, an electric current is supplied to the filament of the electron gun 10 to produce and emit an electron beam 6 from the gun 10. The electron beam 6 emitted upward from the gun 10 is curved toward the evaporation source 2a by the magnetic field 8. Thus, the evaporation source 2a is heated to be vaporized or evaporated due to the electron bombardment, producing a gaseous evaporation source.

The gaseous evaporation source thus produced travels upward toward the substrate 4. This gaseous source enters the inside of the collimator 5 through the window 5b and travels through the collimator 5 to the, substrate 4. Thus, the source is condensed and deposited onto the substrate 4 forming a film of the evaporation metal on the substrate 4.

In FIG. 2, the reference numeral 7 schematically indicates typical paths of the stray electrons. It is seen from the paths 7 that almost all the stray electrons generated in the chamber 1 are prevented from reaching the substrate 4 by the collimator 5 except for those travelling upward to enter the collimator 5.

As described above, with the electron-gun evaporation system according to the first embodiment, the cylindrical wall 5a of the collimator 5 prevents the stray electrons colliding with the wall 5a from reaching the substrate 4 and at the same time, the window 5b of the collimator 5 allows the gaseous evaporation metal to travel to the substrate 4. Therefore, almost all the stray electrons generated in the chamber 1 can be prevented from reaching the substrate 4 by the collimator 5. This means that the problem due to the stray electrons, i.e., the strip-off of the deposited film and/or the radiation damage of the substrate 4 can be solved by providing simply the collimator 5.

Also, since the stream of the gaseous evaporation metal is regulated or adjusted by the window 5b of the collimator 5 and reaches the substrate 4, the metal can be deposited onto the substrate 4 with excellent directionality.

A part of the stray electrons travel through the window 5a of the collimator 5 to reach the substrate 4. However, since almost all the stray electrons can be prevented from reaching the substrate 4 by the wall 5a of the collimator 5, it can be said that the stray electron-induced problem is substantially solved The collimator 5 has another function of preventing impurities from reaching the substrate 4. Since the impurities tend to arise from the inner surfaces of the chamber 1, they can be effectively stopped by the wall 5b of the collimator 5 in the similar way as that of the stray electrons.

The effect by the collimator 5 varies dependent upon the height $H_1$ from the lower end of the wall 5a to the edge of the substrate 4 and the inner diameter $D_1$ of the collimator 5. The height $H_1$ is preferably set mainly in consideration with the function of solving the stray electron-induced problem. The inner diameter $D_1$ is preferably set to be as close to the diameter of the substrate 4 as possible.

Although the wall 5a is cylindrical in the first embodiment, it is not limited thereto. Any other shape may be taken-in-the invention if it is possible to realize the above necessary functions of the collimator 5.

SECOND EMBODIMENT

Figure 3:
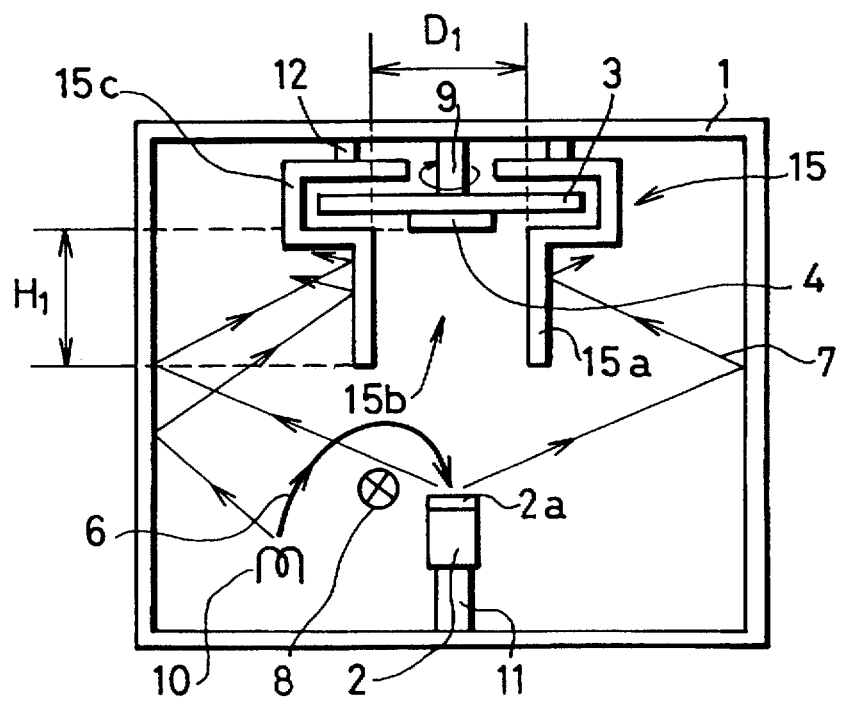
FIG. 3 is a schematic, cross-sectional view of an electron-gun evaporation system according to a second embodiment of the invention.

FIG. 3 shows an electron-gun evaporation system according to a second embodiment. This system is the same in structure as that of the first embodiment except for the collimator. Therefore, only the different structure is described here and the detailed description regarding the same structure is omitted here for the sake of simplification by adding the same reference numerals as those in the first embodiment to the same components.

As shown in FIG. 3, a collimator 15 is fixed onto the top wall of the chamber 1 by a support 12. The collimator 15 is made of stainless steel and is composed of a bottom-less cylindrical wall 15a and a bottom-less cylindrical base wall 15c formed to be integrated with the wall 15a. The upper end of the base wall 15c is fixed onto the chamber 1. A circular window 15b is formed at a lower end of the wall 15a. The base wall 15c surrounds the substrate holder 3 and the substrate 4 when attached onto the holder 3, in other words, the substrate 4 is contained in the collimator 5. The wall 15a is positioned lower than the substrate 4 and is perpendicular to the surface of the substrate 4. The collimator 15 is placed right over the source holder 2.

The central axis of the collimator 15 accords with the center of the holder 3. The substrate 4 is attached onto the holder 3 so that the center of the substrate 4 is positioned on the center Of the holder 3. The collimator 15i has the same functions (a) and (b) as those in the first embodiment.

An evaporation process is performed in the same way as that of the first embodiment. The gaseous evaporation source travels upward to enter the-inside of the collimator 15 through the window 15b and travels through the collimator 15 to the substrate 4. Thus, the source is condensed and deposited onto is the substrate 4 forming a film of the evaporation metal on the substrate 4.

Almost all the stray electrons generated in the chamber 1 are prevented from reaching the substrate 4 by the wall 15a of the collimator 5 except for those travelling upward to enter the collimator 15 through the window 15b.

With the electron-gun evaporation system according to the second embodiment, the collimator 15 is different in structure from that of the first embodiment only in that the base wall 15c of the collimator 15 covers not only the substrate 4 but also the substrate holder 3. Therefore, the same advantage as that of the first embodiment can be obtained.

THIRD EMBODIMENT

Figure 4:
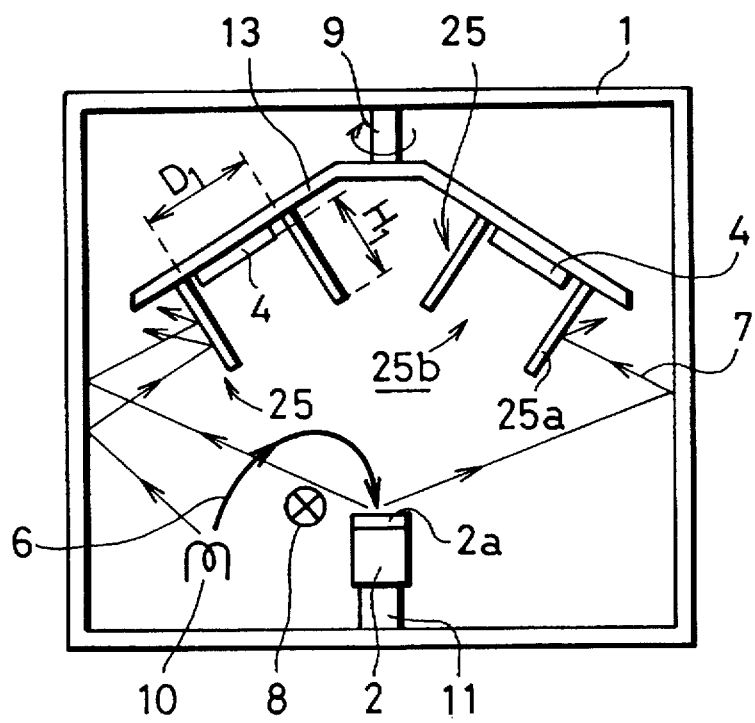
FIG. 4 is a schematic, cross-sectional view of an electron-gun evaporation system according to a third embodiment of the invention.

FIG.4 shows an electron-gun evaporation system according to a third embodiment. This system is the same in structure as that of the first embodiment except that a substrate holder 13 can have a plurality of substrates 4 and a plurality of collimators 25 are provided for the respective substrates 4.

As shown in FIG.4, unlike in the first and second embodiments, the substrate holder 13 has a conical shape, and the substrates 4 are attached onto the holder 13 to be positioned along the circular outer edge at regular intervals.

The collimators 25 are fixed onto the lower side of the holder 13 to surround the respective substrates 4 when attached onto the holder 13. Each of the collimators 25 is made of stainless steel and is composed of a bottom-less cylindrical wall 25a and a circular window 25b formed at a lower end of the wall 25a. The upper end of each wall 15a is fixed onto lower side of the holder 13. The central axis of each collimator 25 accords with the center of each substrate 4. The wall 25a is perpendicular to the corresponding substrate 4. The collimator 25 is placed right over the source holder 2. The collimator 25 has the same functions (a) and (b) as those in the first embodiment.

An evaporation process is performed in the same way as that of the first embodiment. The gaseous evaporation source travels upward to enter the insides of the collimators 25 through the corresponding windows 25b and travels through the collimators 25 to the respective substrates 4. Thus, the source is condensed and deposited onto the substrates 4, forming a film of the evaporation metal on the substrates 4.

Almost all the stray electrons generated in the chamber 1 are prevented from reaching the substrates 4 by the walls 15a of the respective collimators 25 except for those travelling upward to enter the collimators 25 through the windows 25b.

With the electron-gun evaporation system according to the third embodiment, the same advantage as that of the first embodiment can be obtained.

FOURTH EMBODIMENT

Figure 5:
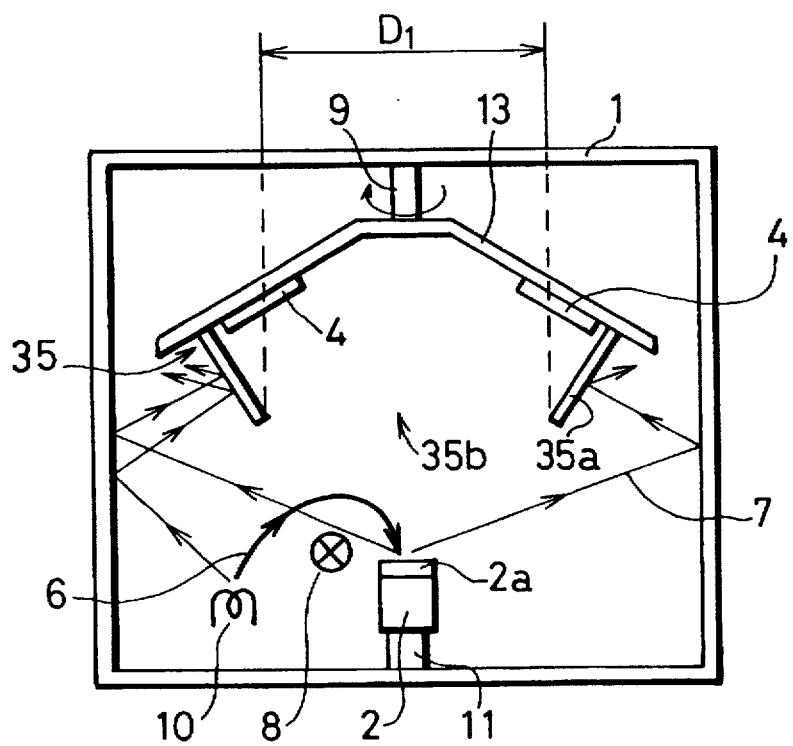
FIG. 5 is a schematic, cross-sectional view of an electron-gun evaporation system according to a fourth embodiment of the invention.

FIG. 5 shows an electron-gun evaporation system according to a fourth embodiment. This system is the same in structure as that of the first embodiment except for the substrate holder 13 and a-megaphone-shaped collimator 35.

As shown in FIG. 5, the conical substrate holder 13, which is capable or holding the substrates 4, is the same in structure as that of the third embodiment. The substrates 4 are attached onto the holder 13 to be positioned along the circular outer edge at regular intervals, which is the same as in the third embodiment.

The collimator 35 is fixed onto the lower side of the holder 13 to surround all the substrates 4 when attached onto the holder 13. The collimators 35 is made of stainless steel and is composed of a bottom-less conical wall 35a and a circular window 35b formed at a lower end of the wall 35a. The upper end of the wall 35a is fixed onto lower side of the holder 13. The central axis of the collimator 35 accords with the center of the holder 13. The wall 35a is perpendicular to the substrates 4. The collimator 35 is placed right over the source holder 2. The collimator 35 has the same functions (a) and (b).as those in the first embodiment.

An evaporation process is performed in the same way as that of the first embodiment. The gaseous evaporation source travels upward to enter the inside of the collimator 35 through the window 35b and travels through the collimator 35 to the substrates 4. Thus, the source is condensed and deposited onto the substrates 4, forming a film of the evaporation metal on the substrates 4.

Almost all the stray electrons generated in the chamber 1 are prevented from reaching the substrates 4 by the wall 35a of the collimator 35 except for those travelling upward to enter the collimator 35 through the window 35b.

With the electron-gun evaporation system according to the fourth embodiment, the same advantage as that of the first embodiment can be obtained.

FIFTH EMBODIMENT

Figure 6:
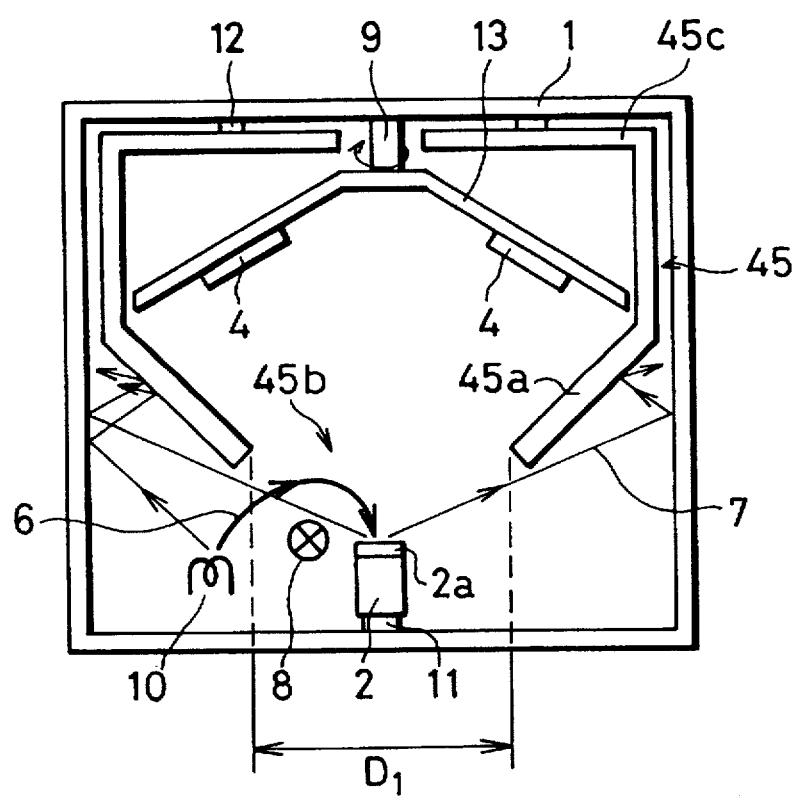
FIG. 6 is a schematic, cross-sectional view of an electron-gun evaporation system according to a fifth embodiment of the invention.

FIG. 6 shows an electron-gun evaporation system according to a fifth embodiment. This system is the same in structure as that of the first embodiment except for the conical substrate holder 13 and a bottle-shaped collimator 45.

As shown in FIG. 6, the substrate holder 13, which is capable of holding the substrates 4, is the same in structure as that of the third embodiment.

The collimator 45 is fixed onto the top wall of the chamber 1 by the support 12 to surround the entire substrate holder 13. The collimator 45 is made of stainless steel and is composed of a bottom-less conical wall 45a, a circular window 45b formed at a lower end of the wall 45a, and a base wall 45c formed to be integrated with the wall 45a. The central axis of the collimator 45 accords with the center of the holder 13. Unlike in the first to fourth embodiments, the wall 45a is oblique to the substrates 4. The collimator 45 is placed right over the source holder 2. The collimator 45 has the same functions (a) and (b) as those in the first embodiment.

An evaporation process is performed in the same way as that of the first embodiment. The gaseous evaporation source travels upward to enter the inside of the collimator 45 through the window 45b and travels through the wall 45a to the substrates 4. Thus, the source is condensed and deposited onto the substrates 4, forming a film of the evaporation metal on the substrates 4.

Almost all the stray electrons generated in the chamber 1 are prevented from reaching the substrates 4 by the wall 45a of the collimator 45 except for those travelling upward to enter the collimator 45 through the window 45b.

With the electron-gun evaporation system according to the fifth embodiment, the same advantage as that of the first embodiments can be obtained.

As described above, in the first to fifth embodiments, even if the substrate 4 has an organic material such as a photoresist or an electron-beam resist, a better evaporation process can be realized on the substrate 4 than the cases of the conventional ones.

In the first to fifth embodiments, although the wall of the collimator is cylindrical having a circular cross-section, any other shape may be employed in the invention.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. An electron-gun evaporation system comprising:
   an evaporation chamber;
   an evaporation source holder for holding an evaporation source, said source holder being placed in said chamber;
   an electron gun for producing an electron beam;
   an electron-beam controller for controlling said electron beam so that said beam is applied to said source when held by said source holder, said source being heated by said beam to generate a gaseous evaporation source;
   an evaporation object holder for holding an evaporation object, said object holder being placed in said chamber; and
   a collimator having a wall that forms a hollow space therein and a window that is formed at an end of said wall, said object being surrounded by said wall when held by said object holder and said collimator providing a path between said source and said object;
   wherein during an evaporation process said gaseous evaporation source flows into said hollow space of said collimator through said window to be collimated and then reaches said object to be deposited thereon;
   and wherein stray electrons generated in said chamber are prevented from being applied to said object held by said object holder by said wall of said collimator.

2. An electron-gun evaporation system comprising:
   an evaporation chamber;
   an evaporation source holder for holding an evaporation source, said source holder being placed in said chamber;
   an electron-gun for producing an electron beam;
   an electron-beam controller controlling said electron beam so that said beam is applied to said source when held by said source holder said, source being heated to generate a gaseous evaporation source;
   an evaporation object holder for holding an evaporation object, said object holder being placed in said chamber; and
   a collimator having a wall that forms a hollow spice therein and a window that is formed at an end of said wall, said object-being surrounded by said wall when held by said object holder and said collimator providing a path between said source and said object;
   wherein during an evaporation process said gaseous evaporation source enters said hollow space of said collimator through said window and reaches said object to be deposited thereon;
   and wherein stray electrons generated in said chamber are prevented from being applied to said object held by said object holder by said wall of said collimator;
   and wherein said collimator is fixed to said object holder at the other end of said wall.

3. The system as claimed in claim 2, wherein said collimator is of a bottom-less cylindrical shape having said window at an end of said collimator.

4. The system as claimed in claim 3, wherein said wall of said collimator extends perpendicular to a surface of said object.

5. An electron-gun evaporation system comprising:
   an evaporation chamber;
   an evaporation source holder for-holding an evaporation source, said source holder being placed in said chamber;
   an electron gun for producing an electron beam;
   an electron-beam controller for controlling said electron beam so that said beam is applied to said source when held by said source holder, said source being heated by said beam to generate a gaseous evaporation source;
   an evaporation object holder for holding an evaporation object, said object holder being placed in said chamber; and
   a collimator having a wall that forms a hollow space therein and a window that is formed at an end of said wall, said object being surrounded by said wall when held by said object holder and said collimator providing a path between said source and said object;
   wherein during an evaporation process said gaseous evaporation source flows into said hollow space of said collimator through said window to be collimated and then reaches said object to be deposited thereon;
   and wherein stray electrons generated in said chamber are prevented from being applied to said object held by said object holder by said wall of said collimator;
   and wherein said collimator is fixed to said chamber to surround said object holder.

6. The system as claimed in claim 5, wherein said wall of said collimator is of a bottom-less cylindrical shape having said window at an end of said wall.

7. The system as claimed in claim 6, wherein said wall of said collimator extends perpendicular to a surface of said object.

8. An electron-gun evaporation system comprising:
   an evaporation chamber;
   an evaporation source holder for holding an evaporation source, said source holder being placed in said chamber;
   an electron gun for producing an electron beam;
   an electron-beam controller for controlling said electron beam so that said beam is applied to said source when held by said source holder, said source being heated by said beam to generate a gaseous evaporation source;
   an evaporation object holder for holding evaporation objects, said object holder being placed in said chamber; and
   collimators each having a wall that forms a hollow space therein and a window that is formed at an end of said wall, each of said objects being surrounded by said wall when held by said object holder and each of said collimators providing a path between said source and each of said objects;
   wherein during an evaporation process said gaseous evaporation source flows into said hollow spaces of said collimators through said corresponding windows to be collimated and then reaches said corresponding objects to be deposited thereon, respectively;
   and wherein stray electrons generated in said chamber are prevented from being applied to said objects held by said object holder by said walls of said collimators.

9. An electron-gun evaporation system comprising:
   an evaporation chamber;
   an evaporation source holder for holding an evaporation source, said source holder being placed in said chamber;
   an electron gun for producing an electron beam;
   an electron-beam controller for controlling said electron beam so that said beam is applied to said source when held by said source holder, said source being heated to generate a gaseous evaporation source;

an evaporation object holder for holding evaporation objects, said object holder being placed in said chamber; and collimators each having a wall that forms a hollow space therein and a window that is formed at an end of said wall, each of said objects being surrounded by said wall when held by said object holder and each of said collimators providing a path between said source and each of said object;

wherein during an evaporation process said gaseous evaporation source enters said hollow spaces of said collimators through said corresponding windows and reaches said corresponding objects to be deposited thereon, respectively;

and wherein stray electrons generated in said chamber are prevented from being applied to said objects held by said object holder by said walls of said collimators;

and wherein said collimators are fixed to said object holder at the other ends of said walls.

10. The system as claimed in claim 9, wherein each of said collimators is of a bottom-less cylindrical shape having said window at an end of said corresponding collimator.

11. The system as claimed in claim 10, wherein each of said walls of said collimators extends perpendicular to a surface of each of said objects.

12. An electron-gun evaporation system comprising:

an evaporation chamber;

an evaporation source holder for holding an evaporation source, said source holder being placed in said chamber;

an electron gun for producing an electron beam;

an electron-beam controller for controlling said electron beam so that said beam is applied to said source when held by said source holder, said source being heated by said beam to generate a gaseous evaporation source;

an evaporation object holder for holding evaporation objects, said object holder being placed in said chamber; and a collimator for regulating a stream of said gaseous evaporation source, said collimator being placed in said chamber; and said collimator providing one or more paths between said source and said objects via a wall that forms a hollow space therein and a window that is formed at an end of said wall, said objects being surrounded by said wall when held by said object holder;

wherein during an evaporation process said gaseous evaporation source flows into said hallow space of said collimator through said window to be collimated an then reaches said objects to be deposited thereon;

and wherein stray electrons generated in said chamber are prevented from being applied to said objects held by said object holder by said wall of said collimator.

13. An electron-gun evaporation system comprising:

an evaporation chamber;

an evaporation source holder for holding an evaporation source, said source holder being placed in said chamber;

an electron for producing an electron beam;

an electron-beam controller for controlling said electron beam so that said beam is applied to said source when held by said source holder, said source being heated to generate a gaseous evaporation source;

an evaporation object holder for holding evaporation objects, said object holder being placed in said chamber; and a collimator for regulating a stream of said gaseous evaporation source, said collimator being placed in said chamber; and said collimator providing one or more paths between said source and said objects via a wall that forms a hollow space therein and a window that is formed at an end of said wall, said objects being surrounded by said wall when held by said object holder;

wherein during an evaporation process said gaseous evaporation source enters said hollow space of said collimator through said window and reaches said objects to be deposited thereon;

and wherein stray electrons generated in said chamber are prevented from being applied to said objects held by said object holder by said wall of said collimator;

and wherein said collimator is fixed to said object holder at the other end of said wall.

14. The system as claimed in claim 13, wherein said collimator is of a bottom-less conical shape having said window at an end of said collimator.

15. The system as claimed in claim 14, wherein said wall of said collimator extends perpendicular to surfaces of said objects.

16. The system as claimed in claim 15, wherein said object holder has a conical shape.

17. An electron-gun evaporation system comprising:

an evaporation chamber;

an evaporation source holder for holding an evaporation source, said source holder being placed in said chamber;

an electron gun for producing an electron beam;

an electron-beam controller for controlling said electron beam so that said beam is applied to said source when held by said source holder, said source being heated to generate a gaseous evaporation source;

an evaporation object holder for holding evaporation objects, said object holder being placed in said chamber; and a collimator for regulating a stream of said gaseous evaporation source, said collimator being placed in said chamber; and said collimator providing one or more paths between said source and said objects via a wall that forms a hollow space therein and a window that is formed at an end of said wall, said objects being surrounded by said wall when held by said object holder;

wherein during an evaporation process said gaseous evaporation source enters said hollow space of said collimator through said window and reaches said objects to be deposited thereon;

and wherein stray electrons generated in said chamber are prevented from being applied to said objects held by said object holder by said wall of said collimator;

and wherein said collimator is fixed to said chamber to surround said object holder.

18. The system as claimed in claim 17, wherein said wall of said collimator is of a bottom-less conical shape having said window at an end of said wall.

19. The system as claimed in claim 18, wherein said wall of said collimator extends obliquely to surfaces of said objects.

* * * * *